United States Patent
Shin et al.

(10) Patent No.: US 11,467,485 B2
(45) Date of Patent: Oct. 11, 2022

(54) BLANKMASK AND PHOTOMASK FOR EXTREME ULTRAVIOLET LITHOGRAPHY

(71) Applicant: S&S TECH Co., Ltd., Daegu-si (KR)

(72) Inventors: Cheol Shin, Daegu-si (KR); Jong-Hwa Lee, Daegu-si (KR); Chul-Kyu Yang, Daegu-si (KR); Gil-Woo Kong, Daegu-si (KR); Gyeong-Won Seo, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 58 days.

(21) Appl. No.: 17/090,603

(22) Filed: Nov. 5, 2020

(65) Prior Publication Data

US 2021/0132487 A1    May 6, 2021

(30) Foreign Application Priority Data

Nov. 5, 2019 (KR) .......... 10-2019-0140110

(51) Int. Cl.
*G03F 1/24* (2012.01)
*G03F 1/38* (2012.01)
*G03F 1/48* (2012.01)

(52) U.S. Cl.
CPC .......... *G03F 1/24* (2013.01); *G03F 1/38* (2013.01); *G03F 1/48* (2013.01)

(58) Field of Classification Search
CPC .......... G03F 1/24; G03F 1/38; G03F 1/48

USPC ............................................. 430/5
See application file for complete search history.

(56) References Cited

U.S. PATENT DOCUMENTS

| | | | | |
|---|---|---|---|---|
| 9,052,601 B2* | 6/2015 | Mikami | .......... | G03F 1/24 |
| 10,126,642 B2* | 11/2018 | Kim | .......... | G03F 1/54 |
| 10,838,123 B2* | 11/2020 | Jaiswal | .......... | G03F 7/70316 |
| 2005/0208389 A1 | 9/2005 | Ishibashi et al. | | |
| 2006/0192147 A1 | 8/2006 | Kandaka et al. | | |
| 2014/0234756 A1 | 8/2014 | Kinoshita | | |

FOREIGN PATENT DOCUMENTS

| | | |
|---|---|---|
| JP | 2018106183 A | 7/2018 |
| KR | 1020040106342 A | 12/2004 |
| KR | 1020070017476 A | 2/2007 |
| KR | 1020100035559 A | 4/2010 |
| KR | 1020140104375 A | 8/2014 |
| KR | 1020160002332 A | 1/2016 |
| TW | 201600919 A | 1/2016 |

* cited by examiner

*Primary Examiner* — Christopher G Young
(74) *Attorney, Agent, or Firm* — William Park & Associates Ltd.

(57) ABSTRACT

A blankmask for extreme ultraviolet lithography includes a reflection film, a capping film, and an absorbing film that are sequentially formed on a transparent substrate, in which the reflection film has a surface roughness of 0.5 nm Ra or less. It is possible to prevent footing of an EUV photomask pattern from occurring, improving flatness of an EUV blankmask, and prevent oxidation and defects of a capping film.

26 Claims, 2 Drawing Sheets

BLANKMASK AND PHOTOMASK FOR EXTREME ULTRAVIOLET LITHOGRAPHY

CROSS-REFERENCE TO RELATED APPLICATION

This application is based on and claims priority under 35 U. S. C. § 119 to Korean Patent Application No. 10-2019-0140110, filed on Nov. 5, 2019, the disclosure of which is herein incorporated by reference in its entirety.

BACKGROUND

1. Field

The disclosure relates to a blankmask and photomask for extreme ultraviolet lithography, and more particularly, to blankmask and photomask for extreme ultraviolet lithography capable of implementing a fine pattern of 14 nm or less, particularly, 10 nm or 7 nm or less using extreme ultraviolet (EUV) light of 13.5 nm as exposure light.

2. Discussion of Related Art

Recently, lithography technology for manufacturing semiconductor is evolving from ArF, ArFi, and multiple (MP) lithography technologies to EUV lithography technology. The EUV lithography technology is technology that is in the limelight for manufacturing semiconductor devices of 10 nm or less because the EUV lithography enables resolution and process simplification by using an exposure wavelength of 13.5 nm.

On the other hand, the EUV lithography technology may not use the existing refractive optical system such as photolithography using KrF or ArF light because EUV light is well absorbed by all materials, and a refractive index of a material at the wavelength is close to 1. For this reason, in the EUV lithography, a photomask using a reflective optical system is used.

A blankmask is a raw material of the photomask, and is structured to include two thin films on a substrate to form a reflective structure: a reflection film reflecting EUV light and an absorbing film absorbing EUV light. In addition, the blankmask may include a capping film that protects the reflection film, a backside conductive film for e-chucking, and the like. More specifically, the blankmask for EUV is structured to include a reflection film made of Mo/Si on a $SiO_2$—$TiO_2$-based low thermal expansion material (LTEM) substrate having a low coefficient of thermal expansion, a ruthenium (Ru)-based capping film on the reflection film, and a tantalum (Ta)-based absorption film on the capping film. The photomask formed in this way has a form in which the absorbing film is patterned, and uses a principle of forming a pattern on a wafer by using a difference in contrast between a reflectance of the reflection film and a reflectance of the absorbing film.

The following problems occur when the pattern is formed using the EUV blankmask as described above.

First, as the size of the pattern to be implemented is miniaturized, problems, such as distortion of the implemented pattern profile, in particular, footing of the pattern, directly affect the resolution. In particular, the footing problem that occurs in a sub-resolution feature size (SFRS) CD pattern for correcting an optical proximity effect as well as a main pattern to be implemented has a fatal effect on the resolution.

Specifically, the tantalum (Ta)-based material forming the absorbing film pattern of the EUV blankmask is generally formed in a two-layer structure, in which a lower layer does not contain oxygen and an upper layer is formed to contain oxygen. In addition, in order to control a shadowing effect, an upper layer containing oxygen has a thickness of 15 nm or less, and recently, is formed to have a thickness of 10 nm or less. Since the upper layer containing oxygen has a property of being etched with a fluorine-based etching gas, in conclusion, a pattern profile of the absorbing film and a phenomenon such as footing are determined by the lower layer of the absorbing film. In addition, the lower layer of the absorbing film is relatively thicker than the upper layer of the absorbing film and an etch radical component is relatively lower than a surface in a depth direction during etching, and thus there is a problem in that the probability of occurrence of the footing phenomenon increases.

Second, the following problems also occur in the flatness of the EUV blankmask.

In general, the flatness of the EUV blankmask may be classified into two types, that is, the flatness of the absorbing film and the flatness of the capping film including the reflection film.

Regarding the flatness of the absorbing film, the absorbing film is a part where the pattern is finally formed after film formation, and residual stress generated during the film formation is released while the pattern is formed, so a registration problem occurs during the release. Recently, the registration problem for each position has emerged as a more important problem due to the size of the fine pattern.

However, in the case of forming a pattern on the current tantalum (Ta)-based absorbing film, there is no registration problem when a pattern of 10 nm or less is formed, but the registration problem due to the residual stress occurs when a pattern of 7 nm or less is formed. Moreover, the registration problem has a more fatal effect on the EUV lithography in which exposure light is obliquely incident at an incident angle of 6°. This is because in the EUV exposure process by reflected light, not only residual stress on the entire of each mask surface but also residual stress in a micro area are different, and thus a pattern position changes in any part and the shadowing effect by the exposure light incident at an angle of 6° increases.

The problem of the flatness of the capping film including the reflection film is related to the stress of a thin film. Since the EUV exposure light is inclined at 6° and is transferred to a wafer PR through a reflection path, when the flatness of the capping film including the reflection film is high, a difference between an ideal reflection path and an actual reflection path occurs, and thus a pattern position error occurs in the transferred pattern. The flatness of the capping film is affected by at least one of a reflection film, an LTEM substrate, and a thin film under the capping film such as a backside conductive film formed on a rear surface of the LTEM substrate. However, the reflection film formed by forming 40 pairs of Mo/Si generally has a convex type cross-sectional shape, and the backside conductive film made of a chromium (Cr)-based material generally has a concave type cross-sectional shape. Accordingly, the convex type of the surface of the reflection film is finally deepened, and thus the flatness further increases. Accordingly, there is a problem in that the path of the actual reflected light has a larger difference from the path of the ideal reflected light, and thus the problem of the pattern position error gets worse.

Third, a ruthenium (Ru)-based material forming the capping film causes the following problems.

The ruthenium (Ru)-based material performs a role of lowering a degree of oxidation and protecting a lower reflection film during etching. However, the ruthenium (Ru)-based material is oxidized by a cleaning solution such as ozone water and DI-water, and ruthenium (Ru) of the capping film and silicon (Si) of the reflection film under the capping film are oxidized due to high energy during the repetitive exposure to the wafer. Accordingly, damage to the capping film occurs, resulting in decreasing reflectivity to the exposure light, increasing a defect occurrence rate, and adversely affecting the thin film (absorbing film, phase-shift film, or the like) on the capping film.

SUMMARY

The disclosure is to provide a blankmask for extreme ultraviolet lithography capable of preventing footing of an EUV photomask pattern from occurring, improving flatness of an EUV blankmask, and preventing oxidation and defects of a capping film.

According to an aspect of the disclosure, a blankmask for extreme ultraviolet lithography includes a reflection film, a capping film, and an absorbing film that are sequentially formed on a transparent substrate, in which the reflection film has a surface roughness of 0.5 nm Ra or less.

The reflection film may be a structure in which one of a Mo/Si structure, a Mo/$B_4$C/Si/C/Mo structure, and a Mo/C/Si/$B_4$C/Mo structure is stacked in a multilayer.

At least one of $B_4$C or C in the reflection film may be formed in a layer having a thickness of 0.1 to 5 nm.

The reflection film may be heat treated at a temperature of 200 to 500° C.

The reflection film or the capping film may be subjected to electrical neutralization treatment for suppressing a formation of an oxide film by e-beam treatment after film formation.

The blankmask may further include a stress control layer provided between the transparent substrate and the reflection film and having a concave type.

The stress control layer may be made of a material that contains at least one of Cr, Ta, B, Mo, V, Co, Ag, Sb, Ti, I, Pb, Ga, Bi, Co, Sn, Te, Ni, Zr, Si, Nb, Pt, Pd, Zn, Al, Mn, Cd, Mg, Li, Se, Cu, Hf, and W, or further contains at least one of oxygen (O), nitrogen (N), carbon (C), boron (B), and hydrogen (H).

The stress control layer may have a thickness of 10 to 100 nm.

The capping film may be made of a material that contains at least one of Ru or Nb, or further contains at least one light element of oxygen (O), nitrogen (N), and carbon (C).

The absorbing film may be made of a tantalum (Ta) compound having a two-layer structure in which an upper layer contains oxygen (O) and a lower layer does not contain oxygen (O).

The lower layer may be made of a material that contains at least one of Ta, TaN, TaCN, TaC, TaB, TaBN, TaBCM, and TaBC, or further contains hydrogen (H).

The lower layer may be formed in a form of a continuous film whose composition ratio changes in a thickness direction.

The absorbing film may be made of a tantalum (Ta) compound having a three-layer structure.

The absorbing film may be formed so that a content of nitrogen (N) in an intermediate layer is 1 to 20 at % higher than that of the lower layer.

The intermediate layer of the absorbing film may have a thickness of 3 to 40 nm.

The absorbing film may have a structure of two or more layers and may be made of a tantalum (Ta) compound, and layers under the upper layer of the absorbing film may have a composition ratio of Ta:N=95 at %:5 at % to 50 at %:50 at %.

The absorbing film may be made of a tantalum (Ta) compound containing boron (B), and may have a composition ratio of 40 to 90 at % of Ta, 5 to 20 at % of B, and 5 to 50 at % of N.

The absorbing film may have a structure of two or more layers and may be made of a tantalum (Ta) compound, and the upper layer may be formed to contain 50 to 90 at % of oxygen (O).

The blankmask may further include a hard mask film formed on the absorbing film.

The hard mask film may be made of a material that contains at least one of Cr, Ta, Mo, V, Co, Ag, Sb, I, Pb, Ga, Bi, Co, Sn. Te, Ni, Zr, Si, Nb, Pt, Pd, Zn, Al, Mn, Cd, Mg, Li, Se, Cu, Hf, and W, or further contains at least one selected from oxygen (O), nitrogen (N), carbon (C), boron (B), and hydrogen (H).

The blankmask may further include a backside conductive film provided under the transparent substrate.

The backside conductive film may have a sheet resistance of 100Ω/□ or less.

The backside conductive film may be made of a material that contains at least one of Cr, Ta, Mo, V, Co, Ag, Sb, I, Pb, Ga, Bi, Co, Sn, Te, Ni, Zr, Si, Nb, Pt, Pd, Zn, Al, Mn, Cd, Mg, Li, Se, Cu, Hf, and W, or further contains at least one of oxygen (O), nitrogen (N), carbon (C), boron (B), and hydrogen (H).

The backside conductive film may be made of chromium (Cr), a chromium (Cr) compound, or a compound in which a metal material is contained in the chromium (Cr). The backside conductive film may have a three-layer structure of a first layer in contact with a rear surface of the transparent substrate, a second layer formed on the first layer, and a third layer formed on the second layer. The first layer and the third layer may contain oxygen (O), and the second layer may not contain oxygen (O).

The first layer and the third layer may have a composition ratio in which chromium (Cr) is 20 to 70 at % and the sum total of C. O, and N is 30 to 80 at %, and the second layer may have a composition ratio of Cr:N=70 at %:30 at % to 20 at %:80 at %.

According to another aspect of the disclosure, there is provided a photo mask for extreme ultraviolet lithography manufactured using the blankmask for extreme ultraviolet lithography having the above configuration.

According to the disclosure, the flatness of the EUV blankmask is improved, and the oxidation and defects of the capping film are prevented. In addition, the footing is prevented from occurring in the pattern of the EUV photomask manufactured by this blankmask.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
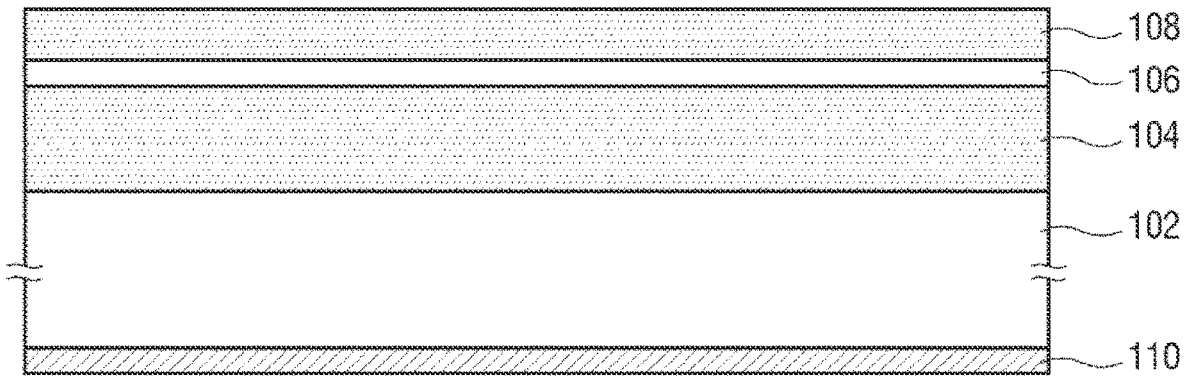
FIG. 1 is a cross-sectional view of a photomask for extreme ultraviolet lithography according to the disclosure.

FIG. 1 is a cross-sectional view illustrating a blankmask for extreme ultraviolet lithography according to the disclosure.

Referring to FIG. 1, a blankmask 100 for extreme ultraviolet lithography according to the disclosure includes a transparent substrate 102 and a reflection film 104, a capping film 106, and an absorbing film 108 that are sequentially stacked on the transparent substrate 102. In addition, the blankmask 100 includes a conductive film 110 provided on a rear surface of the transparent substrate 102.

The transparent substrate 102 is a glass substrate for a reflective blankmask using EUV exposure light of 13.5 nm, and preferably uses a low thermal expansion material (LTEM) substrate having a low coefficient of thermal expansion in a range of $0\pm1.0\times10^{-7}/°$ C., and preferably $0\pm0.3\times10^{-7}/°$ C. in order to prevent deformation of a pattern due to heat and stress due to a thin film during exposure. To this end, the transparent substrate 102 may be made of a material such as $SiO-TiO_2$-based glass, multi-component glass ceramics, or the like.

The transparent substrate 102 needs to have high flatness in order to increase the accuracy of reflected light during exposure. The flatness is represented as a total indicated reading (TIR) value, and the TIR of the transparent substrate 102 is 100 nm or less, preferably 50 nm or less, and more preferably 30 nm or less in an area of 132 $mm^2$ or an area of 142 $mm^2$.

The reflection film 104 provided on the transparent substrate 102 has a function of reflecting the EUV exposure light, and is formed by alternately stacking 40 to 60 layers of molybdenum (Mo) and silicon (Si). The reflection film 104 requires a high reflectance with respect to a wavelength of 13.5 nm in order to improve image contrast. The reflection intensity of the reflection film 104 varies depending on an incident angle of the exposure light and a structure (thickness of each layer) of the reflection film 104. For example, when a normal NA method of 0.33 is applied and the incident angle of the exposure light is 4 to 6°, it is preferable that molybdenum (Mo) and silicon (Si) layers have a thickness of 2.8 nm and 4.2 nm, respectively, and when a high NA method with an incident angle of 8 to 14° is applied, it is preferable that the molybdenum (Mo) and silicon (Si) layers have a thickness of 2 to 4 nm and 3 to 5 nm, respectively.

To reduce diffusion between the respective layers when the molybdenum (Mo) and silicon (Si) layers are formed and to reduce a decrease in reflectance caused by a heat treatment process during the manufacturing process, the reflection film 104 may be made of at least one material selected from $B_4C$ or carbon (C) to a thickness of 0.1 to 5 nm, and preferably a thickness of 0.1 to 1 nm after the molybdenum (Mo) layer is formed. In this way, in detail, the reflection film may be formed in a structure of $Mo/B_4C/Si/C/Mo$ or a structure of $Mo/C/Si/B_4C/Mo$. However, when a thickness of $B_4C$ or carbon is 5 nm or more, the reflectance of the reflection film 104 decreases, and when the thickness of $B_4C$ or carbon is 0.1 nm or less, it is difficult to reduce the diffusion between the Mo/Si layers or the decrease in reflectance due to the thermal change.

The reflection film 104 may be selectively heat treated. The heat treatment may be performed by at least one method selected from furnace, rapid thermal annealing (RTA), and hot-plate in a range of 200 to 500° C. The heat treatment is preferably performed in a temperature range of 250 to 300° C. to reduce the stress of the reflection film 104. On the other hand, when the reflection film 104 is formed, the $B_4C$ or C may be formed to suppress the effect of reducing the reflectance due to the diffusion caused during the heat treatment.

Since the reflection film 104 is easily oxidized when the molybdenum (Mo) comes into contact with the atmosphere and thus the reflectance decreases, an uppermost layer of the reflection film 104 is preferably formed in a silicon (Si) layer as a protective film not to be oxidized. On the other hand, even if the uppermost layer is formed in the silicon (Si) layer, an oxide film is formed on the silicon (Si) layer by high energy during repetitive exposure to a wafer after manufacturing of a mask, which affects either an upper thin film or a lower thin film. Therefore, it is preferable to perform electrical neutralization treatment, for example, electron surface treatment after the reflection film 104 is formed. In this way, surface electrons may be controlled to prevent a change in the thin film such as oxidation.

The reflection film 104 has a reflectance of 65% or more with respect to an EUV exposure wavelength of 13.5 nm, and a reflectance of 65% or less with respect to a wavelength of 193 nm or 257 nm. When the surface flatness of the reflection film 104 is defined by the TIR, the surface flatness has an absolute value of 1,000 nm or less, preferably 500 nm or less, and more preferably 300 nm or less. When the surface flatness of the reflection film 104 is poor, an error occurs in a position where the EUV exposure light is reflected, and as the position error becomes high, the position error of the critical dimension arises. On the other hand, the reflection film 104 has a surface roughness of 0.5 nm Ra or less, preferably 0.3 nm Ra or less, and more preferably 0.1 nm Ra or less in order to suppress diffuse reflection of the EUV exposure light.

Meanwhile, although not illustrated in FIG. 1, a stress control layer may be additionally formed between the transparent substrate 102 and the reflection film 104. The stress control layer may be made of a material having a concave type. Examples of the material may include at least one material selected from Cr, Ta, B, Mo, V, Co, Ag, Sb, Ti, I, Pb, Ga, Bi, Co, Sn, Te, Ni, Zr, Si, Nb, Pt, Pd, Zn, Al, Mn, Cd, Mg, Li, Se, Cu, Hf, and W or at least one material selected from oxygen, nitrogen, carbon, boron, and hydrogen in addition thereto, and may preferably include a material selected from Cr, Mo, Ti, and Si and a compound thereof.

By setting the stress of the stress control layer in the following manner, the residual stress may be controlled to lower the flatness. For example, when the reflection film 104 has a thickness of 800 nm in a convex type, the transparent substrate 102 has a thickness of 30 nm in a convex type, and the backside conductive film 110 has a thickness of 200 nm in a concave type, the stress control layer may be designed to have the range of 100 to 600 nm in a concave type. In addition, when the reflection film 104 has a thickness of 800 nm in a convex type, the transparent substrate 102 has a thickness of 30 nm in a convex type, and the backside conductive film 110 has a thickness of 100 nm in a concave type, the stress control layer may be designed to have a range of 200 to 700 nm in a concave type.

The thickness of the stress control layer is preferably 10 to 100 nm. When the stress control layer is made of a chromium containing material the stress control layer preferably has a range of Cr:N=100:0 to 35:65.

The stress control layer may be heat treated. The stress control layer may be heat treated by at least one method selected from furnace, rapid thermal annealing (RTA), and hot-plate in a range of 100 to 500° C. The heat treatment is preferably carried out in a range of 250 to 400° C.

The capping film 106 is formed on the reflection film 104 and serves to protect the reflection film 104 during a dry etching or cleaning process for pattern formation. To this end, the capping film 106 may be made of ruthenium (Ru) or niobium (Nb) alone, a ruthenium (Ru) compound or a niobium (Nb) compound, or a compound containing both the ruthenium (Ru) and niobium (Nb). Specifically, the capping film 106 may be made of a material in which at least one light element material among oxygen (O), nitrogen (N), and carbon (C) is contained in the ruthenium (Ru) and/or niobium (Nb). In this case, it is preferable that the ruthenium (Ru) or niobium (Nb) as a main element is formed to have a content of 60 at % or more.

The capping film 106 has a thickness of 1 to 10 nm, and preferably a thickness of 1 to 5 nm. When the thickness of the capping film 106 is 1 nm or less, it is difficult to protect the reflection film 104 in the etching and cleaning process, and when the thickness is 10 nm or more, the reflectance of the exposure light of 13.5 nm is attenuated, so the problem of decreasing the image contrast occurs.

The capping film 106 exhibits relatively weak characteristics to a cleaning solution, particularly ozone water and hot DI-water, during the cleaning process. Accordingly, in order to prevent the oxide film from being formed on the capping film 106, a process of suppressing the oxide film from being formed on the surface of the capping film 106 by the electrical neutralization treatment, for example, the e-beam treatment, may be added.

The absorbing film 108 may be formed by various methods such as sputtering, chemical vapor deposition (CVD), atomic layer deposition (ALD), and ion beam deposition (IBD). In particular, the absorbing film 108 may be formed by at least one of the sputtering and the ion beam deposition (IBD).

The absorbing film contains, for example, at least one selected from Cr, Ta, B, Mo, V, Co, Ag, Sb, I, Pb, Ga, Bi, Co, Sn, Te, Ni, Zr, Si, Nb, Pt, Pd, Zn, Al, Mn, Cd, Mg, Li, Se, Cu, Hf, and W, or preferably, further contains at least one light element material of oxygen (O), nitrogen (N), carbon (C), boron (B), and hydrogen (H). In particular, the absorbing film 108 is preferably made of tantalum (Ta) and a compound thereof having a high extinction coefficient for the exposure light.

The absorbing film 108 may be formed in one or more of a single layer structure, a multilayered structure, a single film structure, or a continuous film structure. The absorbing film 108 is preferably formed in two or more layers, and more preferably three or more layers, and the upper layer is formed to contain oxygen (O). Specifically, when the absorbing film is formed in two layers, the upper layer contains a material in which at least oxygen (O) is contained in tantalum (Ta), and the lower layer is formed not to contain oxygen (O). For example, the lower layer is made of at least one material selected from Ta, TaN. TaCN, TaC, TaB, TaBN, TaBCM, and TaBC that do not contain oxygen (O), or a material that further contains a material in which hydrogen (H) is further contained in the at least one material.

On the other hand, the lower layer is preferably formed in the form of a continuous film whose composition ratio changes in a thickness direction. Specifically, the lower layer may be formed in a continuous film in which a content of nitrogen (N) gradually decreases in a depth direction from the surface. In this way, an etching rate increases in the depth direction, and thus a phenomenon such as footing may be solved. On the other hand, since an over etching method may be applied as another method for solving the footing, but may cause damage to the capping film 106, it is more preferable to gradually increase the etching rate in the depth direction.

Meanwhile, when the absorbing film 108 is formed in three layers, each layer of the absorbing film may be formed in the form of the single film in addition to the form of the continuous film as described above. For example, the intermediate layer may be formed to have a content of nitrogen (N) higher than that of the lower layer. Specifically, the content of nitrogen in the intermediate layer may be designed to be 1 at % or more, and preferably 3 at % or more than that of the lower layer. At this time, the difference between the content of nitrogen in the intermediate layer and the content of nitrogen in the lower layer is preferably 20 at % or less. When nitrogen is included in tantalum (Ta), the higher the content of nitrogen (N), the significantly lower the etching rate for a chlorine (Cl)-based gas, and as a result, when the difference in the content of nitrogen (N) is 20 at % or more, the problem in that the pattern profile deteriorates due to a large difference in the etching rate occurs. In addition, when the difference is 1 at % or less, there is no difference in the etching rate, so it is not efficient to improve the footing.

On the other hand, a bias may occur between a resist CD and an absorbing film pattern CD formed by the absorbing film etching process. As the etching rate increases, there is a problem in that the CD changes due to side etching even if the pattern of the absorbing film 108 is etched by dry etching. Therefore, in order to reduce the CD bias due to the side etching, it is preferable that the intermediate layer is etched at a low etching rate. To this end, a method for designing a content of nitrogen (N) in an intermediate layer to be relatively higher than that of the lower layer or designing the content of nitrogen (N) in the intermediate layer to be lower but a thickness of the intermediate layer to be thicker or the like may be used.

On the other hand, the side etching is affected not only by the etching rate but also by the thickness of the intermediate layer. When the thickness of the intermediate layer is 3 nm or less, it is difficult to correct the CD by the side etching, and when the thickness of the intermediate layer is 40 nm or more, it is difficult to improve the footing due to the limitation in the thickness of the lower layer at which the etching rate is fast. Therefore, it is preferable that the thickness of the intermediate layer is 3 to 40 nm or less.

When the absorbing film 108 is formed in two or three layers, the lower layer is preferably formed to have a composition ratio of Ta:N=95 at %:5 at % to 50 at %:50 at %. On the other hand, when the absorbing film 108 is formed to contain boron (B), the absorbing film 108 is preferably formed to have a composition ratio in which Ta is 40 to 90 at %, B is 5 to 20 at %, and N is 5 to 50 at %.

On the other hand, the upper layer of the absorbing film 108 is formed to contain oxygen (O). When the content of oxygen (O) in the upper layer is low, the etching rate for the fluorine (F)-based gas decreases, and thus the etching time of the entire absorbing film 108 significantly increases. Therefore, it is preferable that the content of oxygen contained in TaON and TaBON layers which are the upper layer is 50 to 90 at %.

In addition, the thickness of the upper layer of the absorbing film 108 is formed to have 1 to 10 nm.

Although not illustrated, a hard mask film may be formed on the absorbing film 108. The hard mask film is made of a material having a high etch selectivity for the absorbing film 108 thereunder, in particular, for the upper layer of the absorbing film 108. Specifically, the hard mask film may be made of chromium (Cr) and a chromium (Cr) compound, and may be made of a synthetic material containing chromium (Cr). Specifically, the hard mask film may be made of a material that contains at least one selected from Cr, Ta, Mo, V, Co, Ag, Sb, I, Pb, Ga, Bi, Co, Sn, Te, Ni, Zr, Si, Nb, Pt, Pd, Zn. Al, Mn, Cd, Mg, Li, Se, Cu, Hf, and W, or further contains at least one selected from oxygen (O), nitrogen (N), carbon (C), boron (B), and hydrogen (H).

The hard mask film is formed to have a thickness of 2 to 15 nm. The hard mask film is etched and removed when the lower layer of the absorbing film 108 is etched.

The backside conductive film 110 provided under the transparent substrate 102 is a thin film for e-chucking and affects the flatness of the reflection film 14 thereon. Accordingly, it is preferable that the backside conductive film 110 is formed in a convex type. The backside conductive film 110 may be formed in a single layer film or a multilayer film. It is preferable that the backside conductive film 110 has a sheet resistance of 100Ω/□ or less.

To this end, the backside conductive film may be made of a material that contains at least one of Cr, Ta, Mo, V, Co, Ag, Sb, I, Pb, Ga, Bi, Co, Sn, Te, Ni, Zr, Si, Nb, Pt, Pd, Zn, Al, Mn, Cd, Mg, Li, Se, Cu, Hf, W or further contains at least one of oxygen (O), nitrogen (N), carbon (C), boron (B), and hydrogen (H). Specifically, the backside conductive film may be made of chromium (Cr), a chromium (Cr) compound, or a compound in which a metal material is contained in the chromium (Cr).

Figure 2:
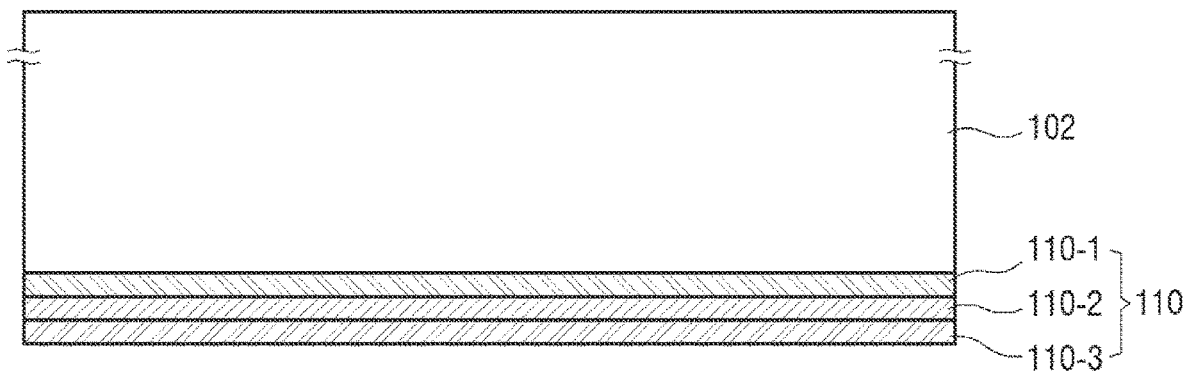
FIG. 2 is a diagram illustrating a specific configuration of a backside conductive film of FIG. 1.

FIG. 2 is a diagram illustrating a specific configuration of the backside conductive film 110.

The backside conductive film 110 may be formed in three layers: a first layer 110-1 in contact with the rear surface of the substrate 102, a second layer 110-2 formed on the first layer 110-1, and a third layer 110-3 formed on the second layer 110-2. In order to form the backside conductive film 110 to have a convex type, the first layer 110-1 in contact with the rear surface of the substrate 102 is formed to contain at least oxygen (O). The second layer 110-2 may contain oxygen (O) and may not contain oxygen (O). When the second layer 110-2 is formed not to contain oxygen (O), a sheet resistance may decrease. The third layer 110-3 preferably contains oxygen (O) in order to increase a frictional force with an electrostatic chuck. Specifically, when the backside conductive film 110 is formed in three layers, the first layer 110-1 and the third layer 110-3 containing oxygen (O) are preferably formed to have a composition ratio in which chromium (Cr) is 20 to 70 at % and the sum total of C, O, and N is 30 to 80 at %, and the second layer is preferably formed to have a composition ratio of Cr:N=70 at %:30 at % to 20 at %:80 at %.

A resist film (not illustrated) provided on the absorbing film 108 or the hard mask film is composed of a chemically amplified resist for e-beam, and has a thickness of 150 nm or less, preferably 100 nm or less, and more preferably 60 nm or less. In addition, the resist film may be composed of a resist for multi e-beam, and the resist film for multi e-beam has an exposure dose of 50 μC/cm$^2$ or more and preferably 70 μC/cm$^2$ or more.

Although not illustrated, an anti-charge layer may be selectively formed on the resist film in order to reduce charge-up of electrons during the e-beam exposure. The anti-charge layer may be made of, for example, a self-doped water soluble conductive polymer. The anti-charge layer has a property of dissolving in ultrapure water, and has a thickness of 5 to 60 nm, and preferably 5 to 30 nm. By preventing the charge-up phenomenon of electrons during the e-beam exposure by the anti-charge layer, the thermal deformation of the resist film may be prevented, and thus the high resolution may be implemented.

Hereinabove, the disclosure has been specifically described through the embodiments of the disclosure, but this is only used for the purpose of illustrating and explaining the disclosure, and is not used to limit the meaning or the scope of the disclosure described in the claims. Therefore, those having ordinary skill in the technical field of the disclosure can understand that various modifications and equivalent other embodiments are possible from the embodiments. Accordingly, an actual technical scope of the disclosure is to be defined by the spirit of the appended claims.

What is claimed is:

1. A blankmask for extreme ultraviolet lithography, comprising:
    a reflection film, a capping film, and an absorbing film that are sequentially formed on a transparent substrate,
    wherein the reflection film has a surface roughness of 0.5 nm Ra or less.

2. The blankmask for extreme ultraviolet lithography of claim 1, wherein the reflection film is a structure in which one of a Mo/Si structure, a Mo/B$_4$C/Si/C/Mo structure, and a Mo/C/Si/B$_4$C/Mo structure is stacked in a multilayer.

3. The blankmask for extreme ultraviolet lithography of claim 2, wherein at least one of B$_4$C or C in the reflection film is formed in a layer having a thickness of 0.1 to 5 nm.

4. The blankmask for extreme ultraviolet lithography of claim 1, wherein the reflection film is heat treated at a temperature of 200 to 500° C.

5. The blankmask for extreme ultraviolet lithography of claim 1, wherein the reflection film or the capping film is subjected to electrical neutralization treatment for suppressing a formation of an oxide film by e-beam treatment after film formation.

6. The blankmask for extreme ultraviolet lithography of claim 1, further comprising:
    a stress control layer provided between the transparent substrate and the reflection film and having a concave type.

7. The blankmask for extreme ultraviolet lithography of claim 6, wherein the stress control layer is made of a material that contains at least one of Cr, Ta, B, Mo, V, Co, Ag, Sb, Ti, I, Pb, Ga, Bi, Co, Sn, Te, Ni, Zr, Si, Nb, Pt, Pd, Zn, Al, Mn, Cd, Mg, Li, Se, Cu, Hf, and W, or further contains at least one of oxygen (O), nitrogen (N), carbon (C), boron (B), and hydrogen (H).

8. The blankmask for extreme ultraviolet lithography of claim 6, wherein the stress control layer has a thickness of 10 to 100 nm.

9. The blankmask for extreme ultraviolet lithography of claim 1, wherein the capping film is of a material that contains at least one of Ru or Nb, or further contains at least one light element of oxygen (O), nitrogen (N), and carbon (C).

10. The blankmask for extreme ultraviolet lithography of claim 1, wherein the absorbing film is of a tantalum (Ta) compound having a two-layer structure in which an upper layer contains oxygen (O) and a lower layer does not contain oxygen (O).

11. The blankmask for extreme ultraviolet lithography of claim 10, wherein the lower layer is made of a material that contains at least one of Ta, TaN, TaCN, TaC, TaB, TaBN, TaBCM, and TaBC, or further contains hydrogen (H).

12. The blankmask for extreme ultraviolet lithography of claim 10, wherein the lower layer is formed in a form of a continuous film whose composition ratio changes in a thickness direction.

13. The blankmask for extreme ultraviolet lithography of claim 1, wherein the absorbing film is made of a tantalum (Ta) compound having a three-layer structure.

14. The blankmask for extreme ultraviolet lithography of claim 13, wherein the absorbing film is formed so that a content of nitrogen (N) in an intermediate layer is 1 to 20 at % higher than that of the lower layer.

15. The blankmask for extreme ultraviolet lithography of claim 14, wherein the intermediate layer of the absorbing film has a thickness of 3 to 40 nm.

16. The blankmask for extreme ultraviolet lithography of claim 1, wherein the absorbing film has a structure of two or more layers and is made of a tantalum (Ta) compound, and layers under an upper layer of the absorbing film may have a composition ratio of Ta:N=95 at %:5 at % to 50 at %:50 at %.

17. The blankmask for extreme ultraviolet lithography of claim 1, wherein the absorbing film is made of a tantalum (Ta) compound containing boron (B), and has a composition ratio of 40 to 90 at % of Ta, 5 to 20 at % of B, and 5 to 50 at % of N.

18. The blankmask for extreme ultraviolet lithography of claim 1, wherein the absorbing film has a structure of two or more layers and may be made of a tantalum (Ta) compound, and an upper layer of the absorbing film is formed to contain 50 to 90 at % of oxygen (O).

19. The blankmask for extreme ultraviolet lithography of claim 1, further comprising:
a hard mask film formed on the absorbing film.

20. The blankmask for extreme ultraviolet lithography of claim 1, wherein the hard mask film is made of a material that contains at least one of Cr, Ta, Mo, V, Co, Ag, Sb, I, Pb, Ga, Bi, Co, Sn, Te, Ni, Zr, Si, Nb, Pt, Pd, Zn, Al, Mn, Cd, Mg, Li, Se, Cu, Hf, and W, or further contains at least one selected from oxygen (O), nitrogen (N), carbon (C), boron (B), and hydrogen (H).

21. The blankmask for extreme ultraviolet lithography of claim 1, further comprising:
a backside conductive film provided under the transparent substrate.

22. The blankmask for extreme ultraviolet lithography of claim 21, wherein the backside conductive film has a sheet resistance of 100Ω/□ or less.

23. The blankmask for extreme ultraviolet lithography of claim 21, wherein the backside conductive film is made of a material that contains at least one of Cr, Ta, Mo, V, Co, Ag, Sb, I, Pb, Ga, Bi, Co, Sn, Te, Ni, Zr, Si, Nb, Pt, Pd, Zn, Al, Mn, Cd, Mg, Li, Se, Cu, Hf, and W, or further contains at least one of oxygen (O), nitrogen (N), carbon (C), boron (B), and hydrogen (H).

24. The blankmask for extreme ultraviolet lithography of claim 21, wherein the backside conductive film is made of chromium (Cr), a chromium (Cr) compound, or a compound in which a metal material is contained in the chromium (Cr),
the backside conductive film has a three-layer structure of a first layer in contact with a rear surface of the transparent substrate, a second layer formed on the first layer, and a third layer formed on the second layer, and
the first layer and the third layer contain oxygen (O), and the second layer may not contain oxygen (O).

25. The blankmask for extreme ultraviolet lithography of claim 24, wherein the first layer and the third layer have a composition ratio in which chromium (Cr) is 20 to 70 at % and a sum total of C, O, and N is 30 to 80 at %, and
the second layer may have a composition ratio of Cr:N=70 at %:30 at % to 20 at %:80 at %.

26. A photo mask for extreme ultraviolet lithography manufactured using the blankmask for extreme ultraviolet lithography of any one of claim 1.

* * * * *